United States Patent
Satoh et al.

(10) Patent No.: US 6,207,537 B1
(45) Date of Patent: Mar. 27, 2001

(54) METHOD FOR FORMATION OF IMPURITY REGION IN SEMICONDUCTOR LAYER AND APPARATUS FOR INTRODUCING IMPURITY TO SEMICONDUCTOR LAYER

(75) Inventors: Noritada Satoh, Yokosuka; Bunya Matsui, Kawasaki, both of (JP)

(73) Assignee: Semiconductor Process Laboratory Co., Ltd. (JP)

( * ) Notice: Subject to any disclaimer, the term of this patent is extended or adjusted under 35 U.S.C. 154(b) by 0 days.

(21) Appl. No.: 09/233,114

(22) Filed: Jan. 19, 1999

(30) Foreign Application Priority Data

Jan. 20, 1998 (JP) ................................................ 10-008563

(51) Int. Cl.[7] .................................................... H01L 21/04
(52) U.S. Cl. ............................................................ 438/510
(58) Field of Search ..................................... 438/510, 513, 438/514, 515, 798; 427/533, 535

(56) References Cited

U.S. PATENT DOCUMENTS 4,618,381 * 10/1986 Sato et al. ............................. 438/513

* cited by examiner

Primary Examiner—Charles Bowers
Assistant Examiner—Keith Christianson
(74) Attorney, Agent, or Firm—Lorusso & Loud

(57) ABSTRACT

The invention relates to method of formation of an impurity region in a semiconductor layer by introducing a dopant impurity as a donor or an acceptor. The formation method comprises the steps of: mixing an impurity gas with a gas containing any one of $H_2$ and an inert gas, electrically discharging the mixed gas, diffusing impurities adhered to the surface of a semiconductor layer into the semiconductor layer, by introducing the discharged impurity gas to the surface of the semiconductor layer and at the same time accelerating ions of the gas containing any one of the $H_2$ and inert gases to irradiate the surface of the semiconductor layer and, by raising the temperature of the surface of the semiconductor layer, electrically activating the same.

7 Claims, 3 Drawing Sheets

METHOD FOR FORMATION OF IMPURITY REGION IN SEMICONDUCTOR LAYER AND APPARATUS FOR INTRODUCING IMPURITY TO SEMICONDUCTOR LAYER

BACKGROUND OF THE INVENTION

1. Field of the Invention

The present invention relates to a method for formation of an impurity region in a semiconductor layer by introduction of a dopant impurity as a donor or an acceptor, and to an apparatus for introducing an impurity into a semiconductor layer.

2. Description of the Prior Art

Methods for formation of an impurity region in a semiconductor substrate include heat diffusion, epitaxial growth, ion implantation, and plasma doping.

These methods require heating at a high temperature (approximately 800–1300° C.) for diffusion of impurities and electric activation of the diffused impurities.

However, such heating of the semiconductor substrate at a high temperature causes problems such as crystal defects in the semiconductor substrate, a penetration of atoms other than a dopant impurity into the semiconductor substrate, or decrease in life time of a minority carrier.

In addition, there are the problems: the depth of the impurity region is as deep as several micrometers or more; and the concentration at the surface of the impurity region cannot be controlled to make a proper concentration of $10^{22}$ atms/cm$^3$ or lower.

SUMMARY OF THE INVENTION

It is the purpose of the invention to provide a method for formation of an impurity region in a semiconductor layer, wherein the impurity region can be formed without heating of the semiconductor layer at a high temperature so that crystal defects in the semiconductor layer and the penetration of a substance other than a dopant impurity into the semiconductor layer can be prevented, and the impurity concentration at the surface of the impurity region can be controlled uniformly to a proper concentration of $10^{22}$ atms/cm$^3$ or lower, and the depth of the impurity region can be controlled to 1 $\mu$m or lower.

According to the invention, an impurity gas is mixed with a gas containing any one of $H_2$ and inert gases, and the mixed gas is electrically discharged.

Electric discharge of the impurity gas generates ions and radicals of the impurity gas. These ions and radicals attach to the surface of a semiconductor layer.

At the same time, the impurity gas is ionized, the gas containing any one of $H_2$ and inert gases is also almost simultaneously ionized. Thus the ions of the gas containing any one of $H_2$ and inert gases are accelerated to collide with the semiconductor layer, resulting in a rise of temperature of the target site. Therefore, thermal energy is given to the impurities on the surface of the semiconductor layer, so that these impurities are diffused into the semiconductor layer, and the impurities are electrically activated. Namely, the surface impurities can be activated simultaneously with the introduction thereof into the semiconductor layer.

These steps allow the impurity region to be formed in the semiconductor layer.

Further, according to the method the present invention for formation of an impurity region in a semiconductor layer, lack of heating the semiconductor layer at a high temperature can reduce thermal stress in the semiconductor layer and crystal defects. The deep penetration of impurities into the semiconductor layer can be also prevented.

Furthermore, the adjustment of the mixing ratio of the impurity gas with the gas containing any one of $H_2$ and inert gases allows adjusting the quantity of impurity activated electrically.

DESCRIPTION OF THE PREFERRED EMBODIMENT

A preferred embodiment according to the invention is described with reference to the drawings.

Figure 1:
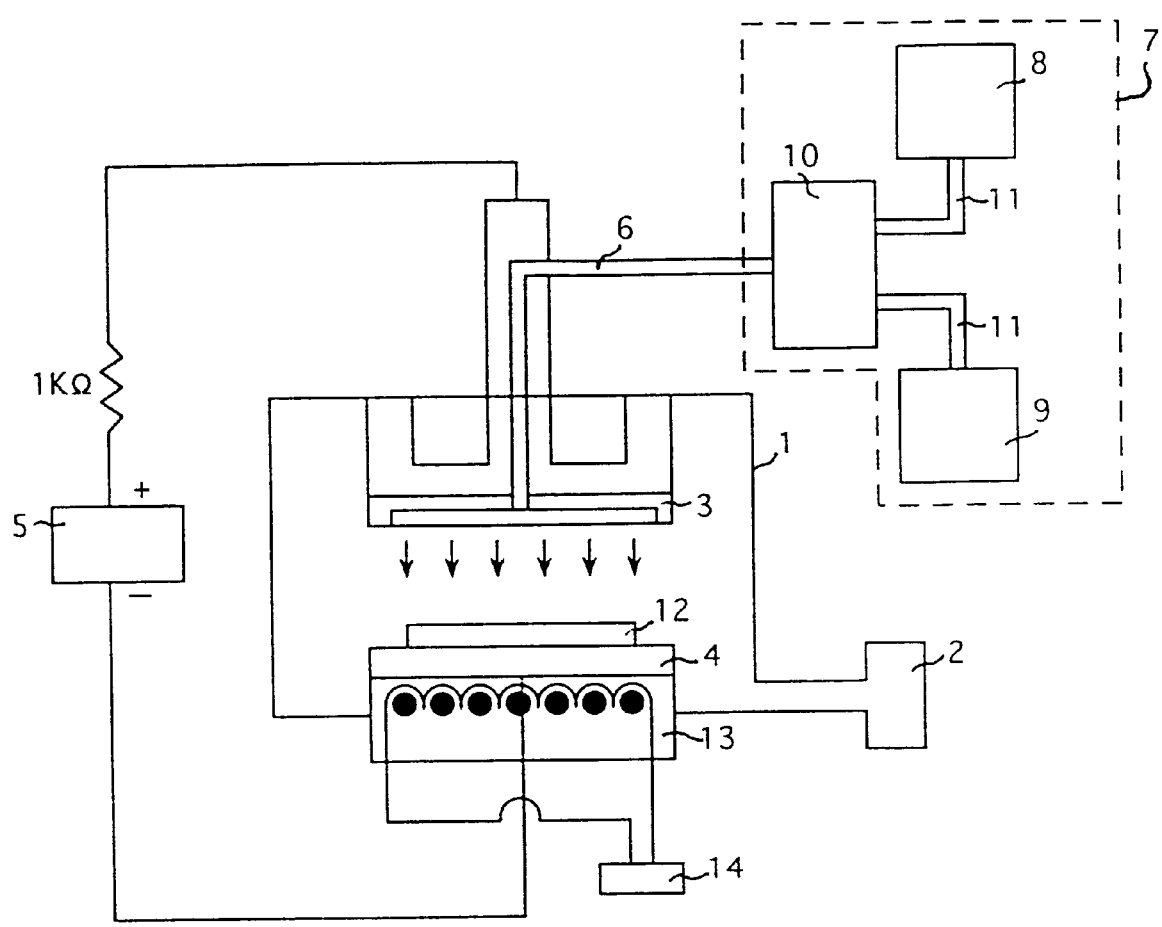
FIG. 1 is a block diagram illustrating an apparatus, according to an embodiment of the present invention, for introducing an impurity into a semiconductor layer.

FIG. 1 is a block diagram illustrating an apparatus for introducing an impurity into a semiconductor substrate in accordance with the invention.

The internal surface of a vacuum chamber 1 is covered with an insulator of quartz glass or the like and connected to exhaust apparatus 2. The exhaust apparatus 2 regulates pressure in the vacuum chamber 1.

The interior of the vacuum chamber 1 is provided with electrodes 3 and 4 opposed to each other. These electrodes 3 and 4 are connected to a DC power source 5 used for generating plasma. These components constitute an electric discharging means. Plasma is generated between the electrodes 3 and 4 by applying a voltage from the DC power source 5.

The DC power source 5 has a circuit for inverting the polarity of the voltage and can supply a pulsed inverse voltage to the electrodes 3 and 4 at a given time interval. The pulsed inverse voltage may be of rectangular waves or triangular waves.

The surface of the electrode 3 opposing to the electrode 4 has a plurality of open outlet pores for dopant impurity gas, which openings ("pores") have a diameter of approximately 1 mm and are evenly distributed over the surface. The set of outlet pores of the electrode 3 is connected to a gas supply apparatus 7 via an insulated pipe 6.

The gas supply apparatus 7 comprises a dopant impurity gas chamber 8, inert gas chamber 9, and regulation means 10, etc. The dopant impurity gas chamber 8 and the inert gas chamber 9 are respectively connected to the regulation means 10 via a pipe 11.

The regulation means 10 comprises a mass flow gauge and a pressure gauge, etc., and regulates the mixing ratio and flow rate of a gas mixed with dopant impurity gas and inert gas, respectively carried from the dopant impurity gas chamber 8 and the inert gas chamber 9.

Subsequently, the mixed gas is carried through the pipe 6 to be discharged from the outlet pores of the electrode 3 into the vacuum chamber 1.

A semiconductor substrate 12 is placed on the electrode 4. On the other hand, a heater 13 for heating the semiconductor substrate is located on the bottom of the electrode 4. The heater 13 is connected to a power source 14 to heat the semiconductor substrate 12.

Next, the following is a description of a method for formation of an impurity region in the semiconductor substrate 12 according to this embodiment.

The semiconductor substrate 12 is placed on the electrode 4. Subsequently, the interior of the vacuum chamber 1 is exhausted by the exhaust apparatus 2 to reduce its pressure to approximately $1.33 \times 10^{-2}$ Pa.

Then, dopant impurity gas and inert gas are respectively carried from the dopant impurity gas chamber 8 and the inert gas chamber 9 to the regulation means 10.

The dopant impurity gas is exemplified by the elements boron, phosphorus, aluminum, arsenic, gallium or the like, hydrogen compounds containing the element or organometallic compounds containing the element. The dopant impurity gas generates electrons and holes (carriers) in a semiconductor.

Examples are diborane ($B_2H_6$) and boron trifluoride that contain boron. Besides, there are phosphorus pentafluoride and phosphine gases that contain phosphorus. Further, there are arsine containing arsenic and trimethylgallium containing gallium. Furthermore, there is trimethylgallium containing aluminum.

On the other hand, Ar or $N_2$ exemplifies the inert gas used for this purpose. In addition, $H_2$ can be used.

The regulation means 10 regulates the mixing ratio and flow rate of the mixing gas composed of dopant impurity gas and inert gas feed to the vacuum chamber 1. As a result, the pressure of the interior of the vacuum chamber 1 is regulated to be within a range of $1.33 \times 10 - 1.33 \times 10^3$ Pa.

The semiconductor substrate 12 is heated to approximately 100° C. For this purpose, the semiconductor substrate 12 may be previously heated.

Following this step, a direct current with a given voltage is applied between the electrodes 3 and the 4 to produce a glow discharge.

Dopant impurity gas between the electrodes 3 and 4 is dissociated by discharge by the direct current voltage applied between the electrodes 3 and 4 to generate ions and radicals. These ions and radicals are propelled to the surface of the semiconductor substrate 12 by the electric field and attached thereto.

At this time, inert gas is almost simultaneously dissociated by discharge to generate ions, and then the ions of inert gas particles are accelerated by the electric field generated between the electrodes 3 and 4 to collide with the semiconductor substrate 12 and raise locally the temperature of the collision site. The impurity particles obtain a thermal energy due to the raised temperature and are activated. With this, the impurity particles are introduced into the semiconductor substrate 12 and electrically activated until the concentration of the exterior and interior of the semiconductor substrate reaches an equilibrated condition.

By these steps, an impurity region having a specific conductivity and type is formed in the surface layer of the semiconductor substrate 12.

The use of direct current voltage in this embodiment is adopted for the following reasons. Using alternating current possibly causes a reaction at the inner wall of the vacuum chamber 1 and an element constituting the vacuum chamber 1 may introduced into the dopant impurity. However, an alternating current method can be selectively applied depending on the type of material of the vacuum chamber 1.

In the use of a direct current voltage, charge-up phenomenon probably occurs. For example, in the case of introducing dopant impurities into the semiconductor substrate 12 through a window which is formed in a $SiO_2$ film, positive ions are accumulated on the surface of the $SiO_2$ film by high electric discharge to cause a dielectric breakdown of the $SiO_2$ film by the high electric field applied to the $SiO_2$, resulting in damage to the surface of the semiconductor substrate 12.

Use of a low pressure reaction gas in an electric discharge in this embodiment allows discharge of positive ions accumulated on the $SiO_2$ film. Therefore, the aforementioned charge-up phenomenon is reduced. However, the use of a very thin $SiO_2$ film or photoresist film is not preferred for preparing a device, because the $SiO_2$ film easily comes to dielectric breakdown. When it takes 1–2 seconds to come to dielectric breakdown, the polarity of an applied direct current voltage is changed at least once every 1–2 seconds. Accordingly, positive ions are neutralized, so that the charge-up phenomenon is reduced and finally the problem is solved.

In addition, the heating temperature for the semiconductor substrate 12 in this embodiment is low as approximately 100° C.

Therefore, thermal stress in the semiconductor substrate 12 is reduced, so that crystal defects, etc. can be reduced. Further, deeper diffusion of dopant impurity into the semiconductor substrate 12 can be prevented.

In general, the discharge allows discharge of particles other than those of dopant impurity and inert gas contained in the vacuum chamber 1. However, a lower temperature for heating the semiconductor substrate 12 can prevent penetration of those discharged particles into the semiconductor substrate.

Further, in this embodiment the use of the gas mixed with dopant impurity gas and inert gas allows electric activation of impurity simultaneously with the impurity arriving at the surface of the semiconductor substrate 12. Besides, the use of the mixed gas, for which the mixing ratio of the dopant impurity gas and inert gas has been adjusted, allows adjusting the quantity of impurity activated electrically.

In the case where the inert gas is irradiated on the surface of the semiconductor substrate 12 after the dopant impurity is adhered to the surface of the semiconductor substrate 12, the following problem occurs. Since there is the possibility of scattering of the adhered impurity by irradiating with the inert gas, adjusting the amount of the impurity introduced becomes difficult.

EXAMPLE

Examples of the invention will be described below with reference to the drawings.

First, the possibility of controlling the impurity concentration on the surface of the semiconductor substrate 12 and the depth of the impurity region of the semiconductor substrate 12 by adjusting the mixing ratio of the dopant impurity gas and an inert gas was investigated.

In the experiment, diborane gas is used as the dopant impurity gas and argon gas as the inert gas. Three mixing ratios were used for the diborane and the argon. In other words, the argon was added to the diborane to make the proportions of the diborane in the mixing gas 10 ppm, 100 ppm, and 1000 ppm.

A mirror finish single crystal wafer of n-type silicon, with a diameter of 150 mm and a resistivity of 10–20 $\Omega$-cm, was used as the semiconductor substrate 12.

A direct current voltage of 600 V was applied between the electrodes 3 and 4 for discharge, with the space between the electrodes 3 and 4 was at 50 mm, and the pressure at 2.66×10² Pa, and these conditions were maintained for 1–3 minutes.

Figure 2:
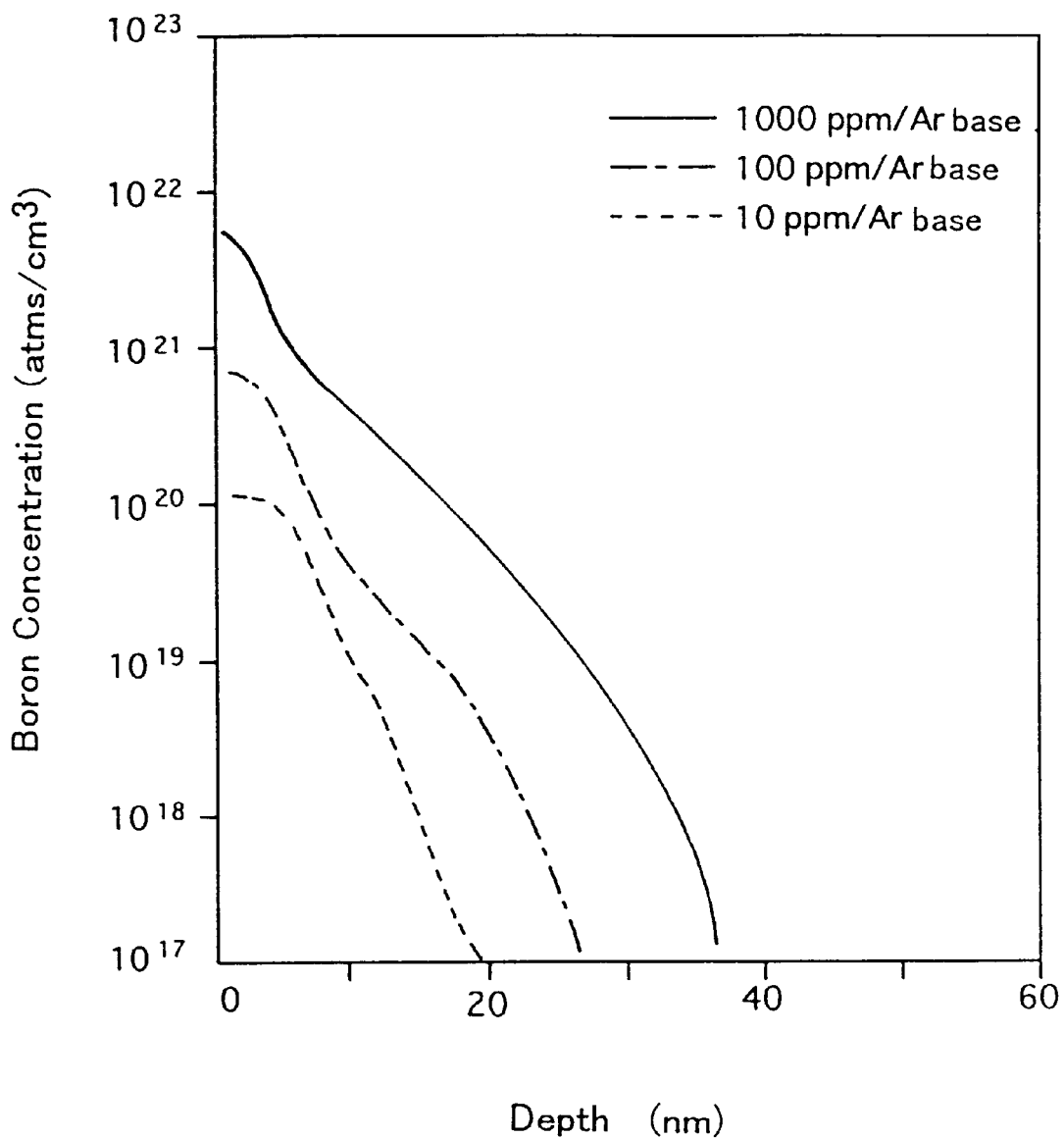
FIG. 2 is a view showing the relationship between the depth from the surface of the silicon wafer and boron concentration.

FIG. 2 is a graph showing the distribution of boron concentration in a silicon wafer, when an impurity region containing boron was formed. The vertical axis represents the concentration of boron and the horizontal axis (abscissa) represents the depth from the surface of the silicon wafer.

The distribution of boron concentration was measured by SIMS (secondary ion mass spectrometer). The principle of measurement by using SIMS is as follows.

A focused ion beam is irradiated onto a sample to cause secondary ions to emit from the sample and these secondary ions are introduced into the mass spectrometer. The secondary ions are detected based on the ratios of electric charge to mass to identify the species of the ions are identified. According to this method, not only electrically active impurities diffused into the semiconductor substrate are detected, but also electrically inactive impurities are all detected.

From the results shown in the FIG. 2, the inventor found that the surface concentration of boron was in a range of $10^{20}$–$10^{22}$ atms/cm³. In addition, the inventor found that the depth of the introduction of boron into the silicon wafer became as shallow as approximately 40 nm or shallower (not deeper than 1 $\mu$m).

Further, the inventor found that the higher the concentration of diborane prepared by dilution with Ar became, the higher the surface concentration of diborane became. This means that adjustment of the concentration of diborane with Ar allows regulation of the surface concentration and of the penetration depth of boron.

Next, it was examined whether boron has been introduced into the silicon wafer evenly or not.

Figure 3A:
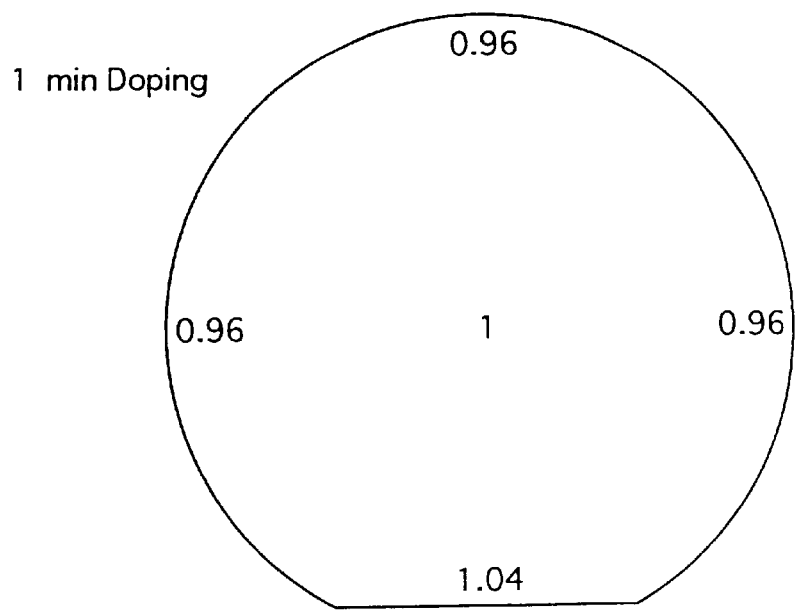
FIG. 3A and FIG. 3B are views showing sheet resistance on the surface of a silicon wafer.
Figure 3B:
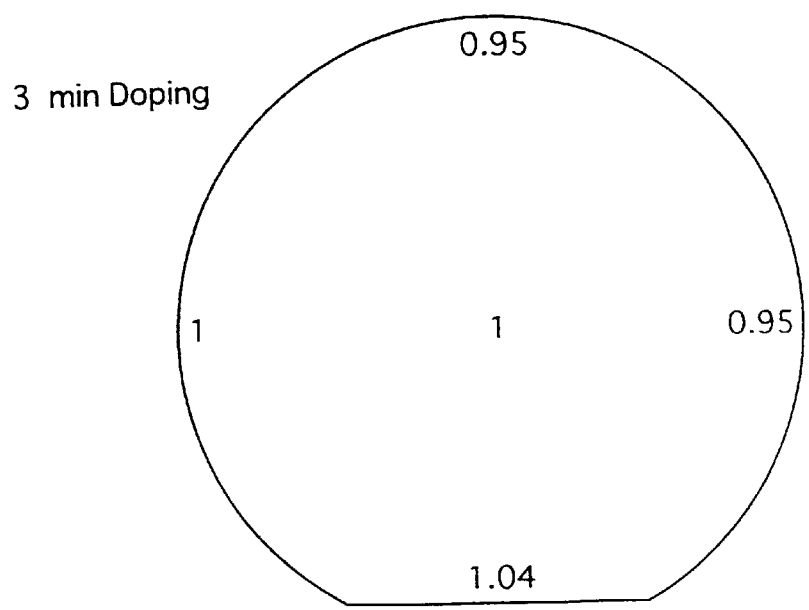

FIGS. 3A and 3B are figures showing the results of measurement of sheet resistance in the silicon wafer. FIGS. 3A and 3B show the results of measurements of the sheet resistance at 1 minute and 3 minutes of discharge time respectively.

The sheet resistance was measured by using a 4 point probe method after determination of 5 measuring points on the silicon wafer.

The method comprises the steps of arranging 4 probes in line at equal spaces, pressing the same probes on the surface of the semiconductor substrate with an equal pressure, establishing a current between two outermost probes, then introducing current to the semiconductor substrate, measuring a voltage generated between two inner probes, and calculating sheet resistance on the basis of this measured voltage.

Further, the concentration of impurity is calculated from the sheet resistance as described below. First, the thickness of the impurity region is separately measured, and the resistivity is calculated on the basis of the thickness and the sheet resistance. Subsequently, the concentration of dopant impurity electrically activated in the semiconductor is calculated from the resistivity.

The numerical values given in the FIGS. 3A and 3B represent ratios of the sheet resistance value at other measuring points, when the sheet resistance in the measuring point in the center of the silicon wafer is assumed 1.

According to FIGS. 3A and 3B, sheet resistance values for the surface of the silicon water are distributed within approximately 0.05% or smaller to suggest evenly doped boron.

Two reasons have been postulated.

As indicated by an arrow in the bottom of the electrode 3 in FIG. 1, one reason is generation of a uniform plasma condition between the electrodes 3 and 4 by the uniform flow of diborane. A second reason is that, by simultaneously irradiating with boron and Ar, adhering of boron to the surface of the silicon wafer and activation of boron are simultaneously realized.

For reference, the rotation of the electrode improves uniformity of the distribution of sheet resistance of the surface of the silicon wafer.

In the impurity region formed with a dopant gas of a 1000 ppm concentration, an impurity concentration of approximately $5\times10^{19}$ atms/cm³ was obtained. This value was obtained at a low temperature of approximately 100° C. in this embodiment and is almost equal to that yielded by heating at 950° C. for 10 seconds in the lamp annealing method. As such, a considerable decrease in process temperature is possible according to the present embodiment.

Though the temperature, for heating the semiconductor substrate with the heater, is described above as approximately 100° C. it is not limited to this. A lower temperature than that used in the prior art can preferably be selected depending on the material of the semiconductor substrate or insulating film and interconnection layer on the substrate.

Furthermore, no problem of an adhered quantity of a metal element discharged from the vacuum chamber on the silicon wafer was found upon examination.

Table 1 gives the quantity of metal elements adhered to the silicon wafer.

TABLE 1

(Unit: $10^{10}$ atm/cm²)

| Sample Plasma | Elect. *1 | Time | Na | Al | Ti | Cr | Fe | Ni | Cu | Zn | W |
|---|---|---|---|---|---|---|---|---|---|---|---|
| $B_2H_6$ | AL | 1 min. | 1.8 | <1 | <0.3 | <0.1 | <2 | <0.4 | <0.05 | <0.1 | <0.008 |
|  |  | 5 min. | 3.9 | 6 | <0.3 | <0.1 | <2 | <0.4 | 1.06 | 3.4 | <0.008 |
|  | SUS | 1 min. | 3.3 | <1 | <0.3 | <0.1 | <2 | <0.4 | <0.05b | <0.1 | <0.008 |
|  |  | 5 min. | 5.3 | 4 | <0.3 | <0.1 | <2 | <0.4 | 0.18 | 0.6 | <0.008 |
| Ar | Al | 1 min. | 2.4 | <1 | <0.3 | <0.1 | <2 | <0.4 | <0.05 | 1.3 | <0.008 |
| $N_2$ | Al | 5 min. | 2.8 | <1 | <0.3 | <0.1 | <2 | <0.4 | <0.05 | 0.8 | <0.008 |
| Carrying only |  |  | 2.7 | 6 | <0.3 | <0.1 | <2 | <0.4 | <0.05 | <0.1 | <0.008 |

*1; electrode

In this experiment, quantity of metals adhered to the silicon wafer was measured in the case of separate plasma discharge of $B_2H_6$, Ar, and $N_2$ in a vacuum chamber 1 and also in the case of "carrying only". "Carrying only" means simply that a silicon wafer was introduced in the vacuum chamber 1 and then removed from the chamber without generating any plasma.

It was found that the separate plasma discharge of $B_2H_6$, Ar, and $N_2$ in a vacuum chamber 1 did not yield an extremely large quantity of metal elements, etc. adhered to the silicon wafer in comparison with "carrying only."

From the results, it can be concluded that elements from the vacuum chamber 1, etc. adhere very little to the silicon wafer so that there is practically no problem in this regard.

Therefore, it can be considered that even when discharging the mixture of inert gas and impurity gas in the present invention, the penetration of particles other than the impurity gas into the semiconductor substrate 12 can be restricted.

As described above, since the semiconductor substrate is not heated to a high temperature, penetration of particles other than the dopant impurity to the semiconductor substrate is prevented and a depth of the impurity region not deeper than 1 $\mu$m can be realized.

In addition, the use of the mixing gas of inert gas and dopant impurity gas allows making the concentration of impurity in the surface of the semiconductor substrate uniform.

Furthermore, control of the mixing ratio of the dopant impurity gas and inert gas allows regulation of the impurity to a proper concentration of $10^{22}$ atms/cm$^3$ or lower.

As described above, according to the present invention, because there is no requirement for heating the semiconductor layer to a high temperature, crystal defects, etc can be decreased, and deep penetration of impurities into the semiconductor layer can be prevented.

Furthermore, the plasma treatment of a gaseous mixture of an impurity gas and any one of $H_2$ and an inert gas allows simultaneous activation of the impurity as well as adherence of the impurity to the surface of the semiconductor layer.

Moreover, the use of a gaseous mixture prepared by adjusting the mixing ratio of the impurity gas with the gas containing any one of $H_2$ and inert gases allows adjusting the introduced amount of impurity.

While the above described embodiment of the present invention used parallel plate electrodes as the discharging means, the invention is not limited to this. For example, electron cyclotron resonance (ECR) may be also used as the discharging means.

What is claimed is:

1. A method for formation of an impurity region in a semiconductor layer comprising the steps of:
   mixing an impurity gas with an inert gas to form a mixed gas;
   contacting said semiconductor layer with an atmosphere of said mixed gas; and
   diffusing the impurity into the semiconductor layer to form the impurity region by producing an electrical discharge in said atmosphere of said mixed gas to cause said impurity gas and said inert gas to simultaneously dissociate into radicals and ions, with said ions of impurity gas adhering to the surface of the semiconductor layer and simultaneously accelerating ions of the inert gas to irradiate the surface of the semiconductor layer, to raise the temperature of the surface of the semiconductor layer and to simultaneously electrically activate the impurities.

2. A method for formation of an impurity region in a semiconductor layer according to claim 1, wherein said electrical discharge is produced by applying a direct current voltage to said mixed gas.

3. A method for formation of impurity region in a semiconductor layer according to claim 1, wherein in said step of diffusing impurities in the semiconductor layer and electrically activating the impurities, said semiconductor layer is heated by heating means.

4. A method for formation of impurity region in a semiconductor layer according to claim 1, wherein the inert gas is Ar or $N_2$.

5. A method for formation of a semiconductor layer according to claim 1, wherein said impurity gas contains an impurity element selected from the group consisting of boron, phosphorus, aluminum, arsenic, and gallium.

6. A method for formation of impurity region in a semiconductor layer according to claim 5, wherein said impurity gas is selected from the group consisting of a gaseous hydrogen compound containing the impurity element, a gaseous halogenated compound containing the impurity element, and gaseous organometallic compounds containing the impurity element.

7. A method for formation of an impurity region in a semiconductor layer according to claim 1, wherein said impurities are introduced into sites in the semiconductor layer by thermal energy created by localized heating of said sites by collision of ions of the inert gas with said sites.

* * * * *